(12) United States Patent
Harikai et al.

(10) Patent No.: US 9,953,906 B2
(45) Date of Patent: Apr. 24, 2018

(54) METHOD OF MANUFACTURING ELEMENT CHIP, METHOD OF MANUFACTURING ELECTRONIC COMPONENT-MOUNTED STRUCTURE, AND ELECTRONIC COMPONENT-MOUNTED STRUCTURE

(71) Applicant: Panasonic Intellectual Property Management Co., Ltd., Osaka (JP)

(72) Inventors: Atsushi Harikai, Osaka (JP); Shogo Okita, Hyogo (JP); Noriyuki Matsubara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/408,750

(22) Filed: Jan. 18, 2017

(65) Prior Publication Data
US 2017/0229384 A1 Aug. 10, 2017

(30) Foreign Application Priority Data
Feb. 4, 2016 (JP) ................................ 2016-019866

(51) Int. Cl.
*H01L 21/784* (2006.01)
*H01L 23/498* (2006.01)
(Continued)

(52) U.S. Cl.
CPC .... *H01L 23/49811* (2013.01); *H01L 21/3065* (2013.01); *H01L 21/30655* (2013.01);
(Continued)

(58) Field of Classification Search
CPC .................. H01L 21/563; H01L 21/78; H01L 2224/80801; H01L 23/3171;
(Continued)

(56) References Cited

U.S. PATENT DOCUMENTS 8,383,436 B2 * 2/2013 Arita ................. H01J 37/32082
438/113
8,557,682 B2 * 10/2013 Holden ................... H01L 21/78
257/E21.599

(Continued)

FOREIGN PATENT DOCUMENTS

JP 2002-093752 A 3/2002

*Primary Examiner* — Bac Au
(74) *Attorney, Agent, or Firm* — Pearne & Gordon LLP (57) ABSTRACT

In a plasma processing step that is used in the method of manufacturing the element chip for manufacturing a plurality of element chips by dividing a substrate which has a plurality of element regions and of which an element surface is covered by insulating film, the substrate is divided into element chips by exposing the substrate to a first plasma, element chips having first surface, second surface, and side surface are held spaced from each other on carrier, insulating film is in a state of being exposed, recessed portions are formed by retreating insulating film by exposing element chips to second plasma for ashing, and then recessed portions are covered by protection films by third plasma for formation of the protection film, thereby suppressing creep-up of the conductive material to side surface in the mounting step.

6 Claims, 6 Drawing Sheets

(51) Int. Cl.
*H01L 21/3065* (2006.01)
*H01L 21/56* (2006.01)
*H01L 21/78* (2006.01)
*H01L 23/31* (2006.01)
*H01L 23/00* (2006.01)

(52) U.S. Cl.
CPC ............ *H01L 21/563* (2013.01); *H01L 21/78* (2013.01); *H01L 21/784* (2013.01); *H01L 23/3171* (2013.01); *H01L 23/3185* (2013.01); *H01L 24/09* (2013.01); *H01L 24/89* (2013.01); *H01L 2224/80801* (2013.01); *H01L 2924/15323* (2013.01)

(58) Field of Classification Search
CPC ........... H01L 23/3185; H01L 23/49811; H01L 24/09; H01L 24/89; H01L 2924/15323; H01L 21/30655; H01L 21/784; H01L 21/3065
See application file for complete search history.

(56) References Cited

U.S. PATENT DOCUMENTS

| | | | | |
|---|---|---|---|---|
| 8,637,967 | B2* | 1/2014 | Menath | H01L 23/3114 257/618 |
| 8,778,806 | B2* | 7/2014 | Johnson | H01L 21/3065 438/714 |
| 9,224,622 | B2* | 12/2015 | Ichihara | H01L 23/552 |
| 9,236,264 | B2* | 1/2016 | Matsuzaki | H01L 21/822 |
| 9,362,366 | B2* | 6/2016 | Yanase | H01L 24/83 |
| 9,553,021 | B2* | 1/2017 | Menath | H01L 21/78 |
| 9,570,314 | B2* | 2/2017 | Nelson | H01L 23/3114 |
| 9,589,812 | B2* | 3/2017 | Takahashi | B81C 1/00531 |
| 2015/0262879 | A1* | 9/2015 | Sakai | H01L 21/78 438/460 |
| 2016/0172203 | A1* | 6/2016 | Ono | H01L 21/6836 438/462 |
| 2017/0194205 | A1* | 7/2017 | Stranzl | H01L 21/78 |

* cited by examiner

METHOD OF MANUFACTURING ELEMENT CHIP, METHOD OF MANUFACTURING ELECTRONIC COMPONENT-MOUNTED STRUCTURE, AND ELECTRONIC COMPONENT-MOUNTED STRUCTURE

BACKGROUND

1. Technical Field

The present disclosure relates to a method of manufacturing an element chip in which element chips are manufactured by dividing a substrate having a plurality of element regions for each element region, a method of manufacturing an electronic component-mounted structure which is formed by mounting the element chip on a substrate, and an electronic component-mounted structure.

2. Description of the Related Art

An element chip such as a semiconductor element is manufactured by dividing a wafer substrate having a plurality of element regions into individual pieces (for example, see PTL 1). In the related art illustrated in PTL 1, first, a back surface of a wafer is polished and the wafer is thinned by etching in a state where a front surface of the wafer is stuck to a back grinding tape. Thereafter, a resist layer is formed in a portion corresponding to the element region for masking, and the wafer is subjected to plasma etching, thereby separating the wafer into individual pieces of the semiconductor elements.

CITATION LIST

Patent Literature

PTL 1: Japanese Patent Unexamined Publication No. 2002-93752

SUMMARY

An individual piece of the element chip that is cut out from the wafer substrate in the above-described manner may not only be used as a device after packaging is performed but also may be sent to an electronic component mounting step in a form of the element chip as it is as in a case of a Wafer Level Chip Size Package (WLCSP) or the like. In such a case, the element chip is mounted in a manner in which a circuit-formed surface comes directly into contact with a conductive material such as cream solder or silver paste for bonding.

An object of the disclosure is to provide a method of manufacturing an element chip in which creep-up of a conductive material in a mounting step can be suppressed, a method of manufacturing an electronic component-mounted structure, and an electronic component-mounted structure.

A method of manufacturing an element chip of the disclosure, in which a plurality of element chips are manufactured by dividing a substrate, which includes a first surface having a plurality of element regions defined by dividing regions and of which at least a part is covered with an insulating film, a second surface on a side opposite to the first surface, at the dividing regions, has the following features. That is, the method includes a preparing step of preparing the substrate in which the first surface side is supported on a carrier and an etching-resistant layer is formed so as to cover regions of the second surface opposite to the element regions and to expose regions of the second surface opposite to the dividing regions; and a plasma processing step of performing plasma processing on the substrate that is supported on the carrier after the preparing step. The plasma processing step includes a dividing step, a recessed portion forming step that is performed after the dividing step, and a protection film forming step that is performed after the recessed portion forming step. In the dividing step, the substrate is divided into the element chips by etching the substrate of regions which are not covered by the etching-resistant layer in a depth direction of the substrate up to the first surface by exposing the second surface to first plasma. In addition, each of the element chips including the first surface, the second surface, and a side surface connecting the first surface and the second surface is caused to be in a state of being held spaced from each other on the carrier and to expose the insulating film at a corner portion formed by the side surface and the first surface of each of the element chips. In the recessed portion forming step, recessed portions are formed by retreating the insulating film that is exposed to the corner portion by exposing the element chips to second plasma in a state where the element chips are held spaced from each other on the carrier. In the protection film forming step, a protection film is formed on the second surface of the element chips, the side surface of the element chips, and the recessed portion by exposing the element chips to third plasma generated during supplying of protection film forming gas in a state where the element chips are held spaced from each other on the carrier.

A method of manufacturing an electronic component-mounted structure of the disclosure, which is formed by bonding element electrodes included on a first surface of an element chip formed by the method of manufacturing an element chip of the disclosure to land electrodes formed in a printed circuit board by bonding portions formed by the element electrodes and solders, has the following features. That is, the method includes a solder paste supplying step of supplying a solder paste including a solder on the land electrodes; and a mounting step of mounting the element electrodes on the printed circuit board by causing the element electrodes to be landed on the solder paste supplied on the corresponding to land electrodes. Furthermore, the method includes a melting step of forming the bonding portions for soldering between the element electrodes and the land electrodes by melting the solder by heating the printed circuit board; and a cooling step of solidifying the melted solder by cooling the printed circuit board. Therefore, in the melting step, the protection film that is formed in the recessed portions suppresses creep-up of the melted solder on the side surface.

An electronic component-mounted structure of the disclosure, which is formed by bonding element electrodes formed in an element chip to land electrodes formed in a printed circuit board by solder, has the following features. That is, the element chip has the element electrodes that are formed in a surface opposite to the printed circuit board, the recessed portions that are formed in corner portions of a side surface of the element chip on the printed circuit board side, and a protection film that covers the recessed portions. Creep-up of the solder on the side surface is suppressed by the protection film.

According to the disclosure, it is possible to suppress creep-up of a conductive material in the mounting step.

DETAILED DESCRIPTION

Prior to the description of an embodiment of the disclosure, problems in the device of the related art will be briefly described.

As described above, in a case where the element chip such as the WLCSP is sent to an electronic component mounting step as it is, the element chip is mounted in a manner in which the circuit-formed surface comes directly into contact with the conductive material such as cream solder or silver paste for bonding. In the mounting step, the conductive material that is pressed and expanded during mounting the element chip is spread not only on the bonding portion of the circuit-formed surface but also on a side surface or a back surface of the element chip, that is, a so-called "creep-up" may occur. The creep-up of the conductive material causes various problems such as causing short-circuit between adjacent electrodes and an increase in current consumption by forming an unnecessary electric circuit on the side surface of the element chip. Therefore, it is required to suppress the creep-up of the conductive material in the mounting step.

Next, an embodiment of the disclosure will be described with reference to the drawings. First, a method of manufacturing an element chip of the embodiment will be described with reference to FIGS. 1A to 1C and 2A to 2C. The method of manufacturing the element chip illustrated in here is used for manufacturing a plurality of element chips by dividing a substrate, which includes a first surface having a plurality of element regions defined by dividing regions and of which at least a part is covered by an insulating film, and a second surface on a side opposite to the first surface, into the dividing regions.

Figure 1A:
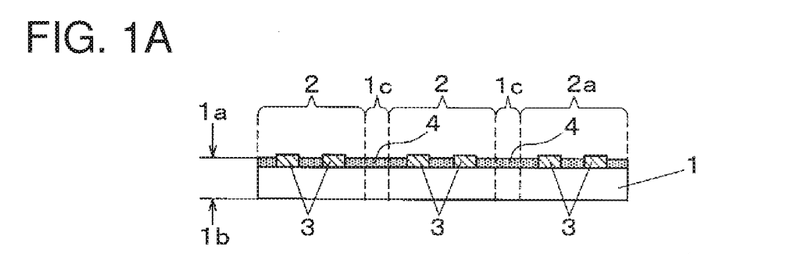
FIG. 1A is an explanatory view of a step in a method of manufacturing an element chip of an embodiment of the disclosure.

As illustrated in FIG. 1A, substrate 1 is a wafer substrate where a plurality of element chips 10 (see FIG. 1C) are formed on first surface 1a. First surface 1a that is an element surface in which an element portion is formed is covered by insulating film 4 formed of an organic film such as polyimide and a plurality of element regions 2 defined by dividing regions 1c are set in first surface 1a in substrate 1. A plurality of element electrodes 3 for connection are formed in each element region 2 so as to protrude from insulating film 4 or so that at least a part thereof exposes from opening provided in insulating film 4. Substrate 1 is sent to a preparing step for manufacturing the element chips and, as described below, support is performed by carrier 6 and mask formation is performed. As carrier 6, a dicing tape that is held by a dicing frame or a support substrate that includes adhesive layer 7 in holding surface 6a may be exemplified.

Figure 1B:
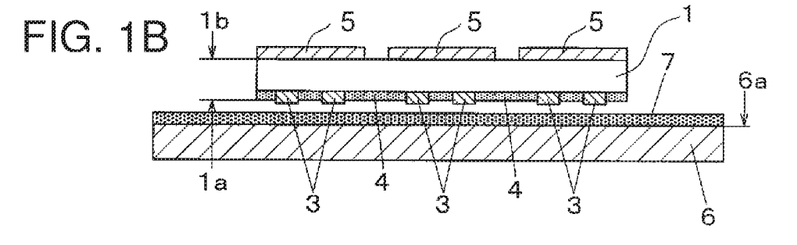
FIG. 1B is an explanatory view of a step in the method of manufacturing the element chip of an embodiment of the disclosure.

In the preparing step, as illustrated in FIG. 1B, etching-resistant layer 5 that functions as a mask in plasma dicing is formed in second surface 1b. That is, etching-resistant layers 5 are formed in second surface 1b so as to cover regions of second surface 1b facing element regions 2 and expose regions of second surface 1b facing dividing regions 1c. In addition, first surface 1a side of substrate 1 is supported on holding surface 6a of carrier 6 by partially embedding a tip end surface of element electrode 3 in adhesive layer 7 of carrier 6. Moreover, in the preparing step, the mask formation may be performed before being supported by carrier 6 or after being supported by carrier 6.

Figure 3:
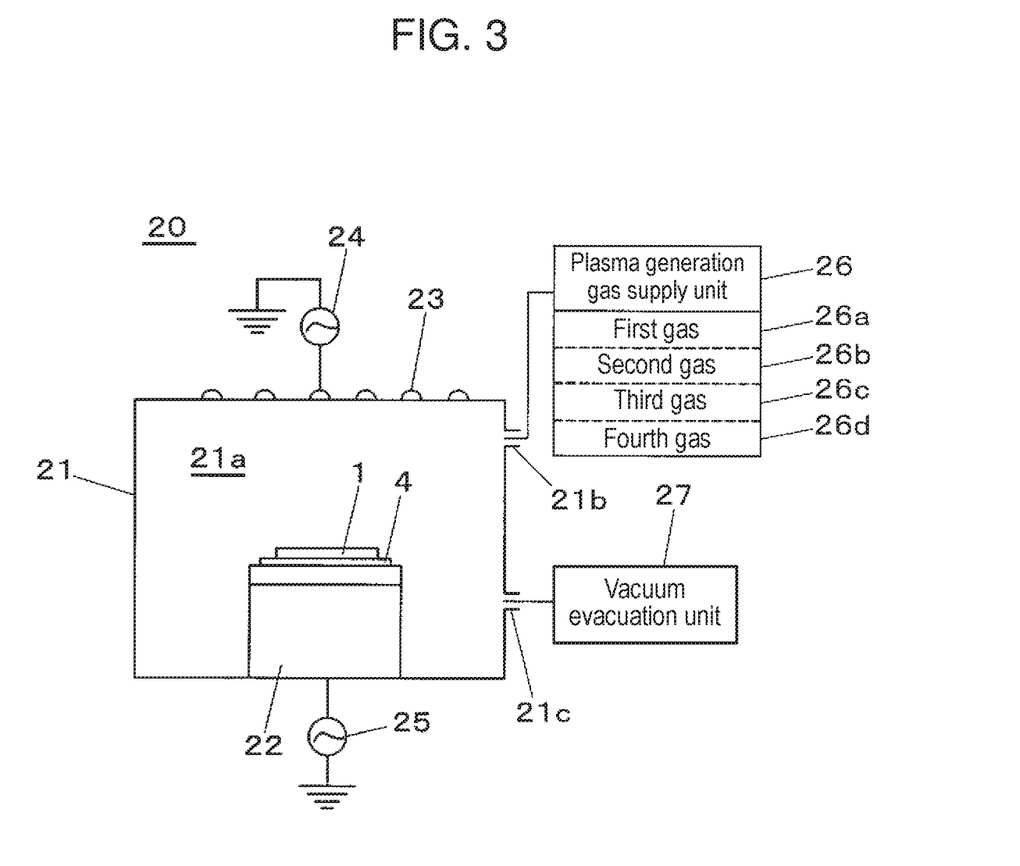
FIG. 3 is an explanatory view of a configuration of a plasma etching device that is used in the method of manufacturing the element chip of an embodiment of the disclosure.

After performing the preparing step as described above, in order to perform plasma processing on substrate 1 that is supported on carrier 6, carrier 6 is sent to a plasma processing step. A configuration of plasma etching device 20 that is used in the plasma processing step will be described with reference to FIG. 3. In FIG. 3, an inside of chamber 21 that is a vacuum vessel is processing chamber 21a for performing plasma processing and stage 22, on which carrier 6 supporting substrate 1 that is to be processed is mounted, is disposed on a bottom portion of processing chamber 21a. Antennas 23 as upper electrodes are disposed on an upper surface of a top portion of chamber 21 and antenna 23 is electrically connected to first high-frequency power supply unit 24. Stage 22 within processing chamber 21a also has a function as a lower electrode for performing plasma processing and stage 22 is electrically connected to second high-frequency power supply unit 25.

Vacuum evacuation unit 27 is connected to chamber 21 via exhaust port 21c and the inside of processing chamber 21a is evacuated by driving vacuum evacuation unit 27. Furthermore, plasma generation gas supply unit 26 is connected to processing chamber 21a via gas inlet port 21b. In plasma etching device 20 illustrated in the embodiment, it is possible to selectively supply a plurality of types of plasma generation gas depending on the purpose of plasma processing. Here, as the types of plasma generation gas, first gas 26a, second gas 26b, third gas 26c, and fourth gas 26d may be selected.

As first gas 26a, gas such as SF6 which is excellent in etching effect for silicon as a target is used. In the embodiment, first gas 26a is used for generating first plasma P1 to divide substrate 1 by plasma etching. Second gas 26b is oxygen gas and, in the embodiment, is used for purpose of removing the organic film such as removing etching-resistant layer 5 after completion of the mask function or partially removing insulating film 4 for forming recessed portions C (see FIGS. 2A to 2C and FIGS. 4A to 4C).

Third gas 26c is gas for plasma CVD to form a film by plasma processing and gas containing fluorocarbon such as $C_4F_8$, $C_2F_6$, $CF_4$, $C_6F_6$, $C_6F_4H_2$, $CHF_3$, and $CH_2F_2$ is used for third gas 26c. In the embodiment, third gas 26c is used as gas for forming the protection film to form the protection film on the side surface, second surface 1b, and side surface 10c of element chip 10, and recessed portions C obtained by dividing substrate 1. Fourth gas 26d is gas for protection film etching and gas such as $SF_6$ gas, oxygen gas, and argon gas which are excellent in physical etching effect is used for fourth gas 26d. In the embodiment, fourth gas 26d is used for sputtering for removing an unnecessary portion among the protection film described above.

In plasma processing by plasma etching device 20, first, substrate 1 to be processed is mounted on stage 22 together with carrier 6 and the inside of processing chamber 21a is excavated to be vacuum by driving vacuum evacuation unit 27. At the same time, plasma generation gas depending on the purpose of plasma processing is supplied on the inside of processing chamber 21a by plasma generation gas supply unit 26 and the inside of processing chamber 21a is maintained at a predetermined pressure. In this state, high-frequency power is supplied on antenna 23 by first high-frequency power supply unit 24 and thereby plasma according to the type of plasma generation gas, which is supplied, is generated on the inside of processing chamber 21a.

In this case, a bias voltage is applied to stage 22 as the lower electrode by second high-frequency power supply unit 25. Therefore, it is possible to exert a biasing effect for promoting entry of plasma generated on the inside of processing chamber 21a in a direction of stage 22 and to perform anisotropic etching by enhancing a plasma processing effect in a desired specific direction.

Figure 1C:
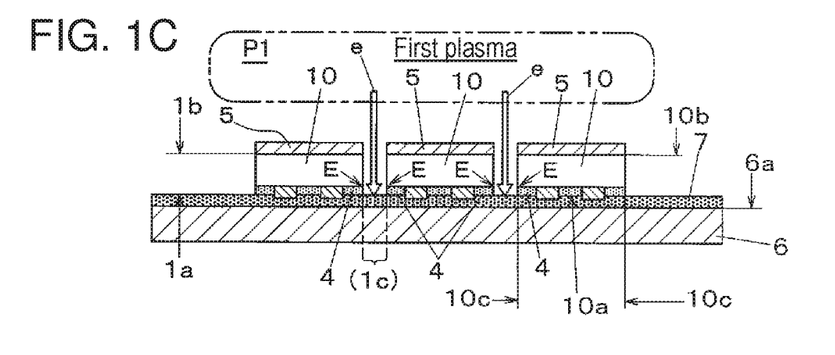
FIG. 1C is an explanatory view of a step in the method of manufacturing the element chip of an embodiment of the disclosure.

In the plasma processing step, first, processing is executed by first plasma P1 using first gas 26a described above. As illustrated in FIG. 1C, regions which are not covered by etching-resistant layer 5, that is, substrate 1 of regions corresponding to dividing regions 1c illustrated in FIG. 1A are etched (see arrows e) until reaching first surface 1a in the depth direction of substrate 1 by exposing second surface 1b of substrate 1 to first plasma P1 described above. Etching grooves 11 (see FIG. 2A) separating each element chip 10 are formed, and substrate 1 is divided into element chips 10 of individual pieces.

That is, element chips 10 including first surface 10a that is first surface 1a, second surface 10b that is second surface 1b in the state of substrate 1, and side surface 10c connecting first surface 10a and second surface 10b are in a state of being held spaced from each other on carrier 6 by dividing substrate 1. With this division, an end portion of insulating film 4 is in a state of being exposed to corner portion E formed by side surface 10c and first surface 10a of element chip 10 (dividing step).

Etching conditions in the dividing step can be appropriately selected depending on a material of substrate 1. In a case where substrate 1 is a silicon substrate, for etching in the dividing step, a so-called Bosch process can be used.

In the Bosch process, it is possible to burrow the region that is not covered by etching-resistant layer 5 perpendicular to the depth direction of the substrate 1 by sequentially repeating a deposition film depositing step, a deposition film etching step, and a silicon etching step.

As conditions of the deposition film depositing step, for example, a pressure on the inside of processing chamber is adjusted to 15 to 25 Pa while supplying $C_4F_8$ as raw material gas at 150 to 250 sccm, input power from first high-frequency power supply unit 24 to antenna 23 is 1500 to 2500 W, input power from second high-frequency power supply unit 25 to the lower electrode is 0 W, and a processing time may be 5 to 15 seconds. As conditions of the deposition film etching step, for example, the pressure on the inside of processing chamber is adjusted to 5 to 15 Pa while supplying $SF_6$ as raw material gas at 200 to 400 sccm, input power from first high-frequency power supply unit 24 to antenna 23 is 1500 to 2500 W, input power from second high-frequency power supply unit 25 to the lower electrode is 100 to 300 W, and the processing time may be 2 to 10 seconds. Here, sccm is a unit indicating the amount of flow of a gas. That is, 1 sccm indicates the amount of flow of a gas that flows by 1 $cm^3$ per minute at 0° C. and 1 atmosphere (standard condition).

As conditions of the silicon etching step, for example, the pressure on the inside of processing chamber is adjusted to 5 to 15 Pa while supplying $SF_6$ as raw material gas at 200 to 400 sccm, input power from first high-frequency power supply unit 24 to antenna 23 is 1500 to 2500 W, input power from second high-frequency power supply unit 25 to the lower electrode is 50 to 200 W, and the processing time may be 10 to 20 seconds. In these conditions, it is possible to burrow the silicon substrate at a speed of 10 μm/min by repeating the deposition film depositing step, the deposition film etching step, and the silicon etching step.

Figure 2A:
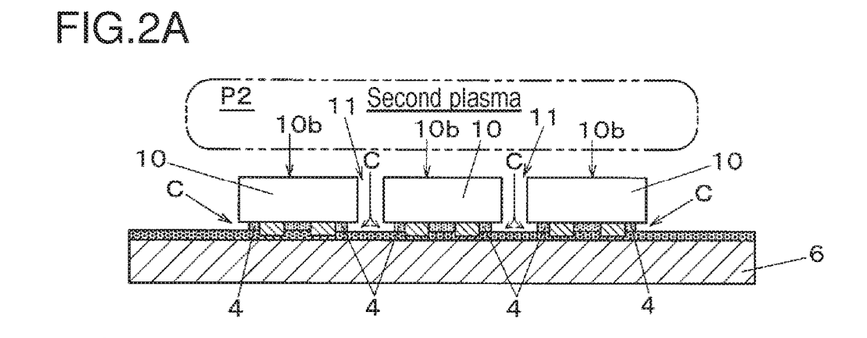
FIG. 2A is an explanatory view of a step in the method of manufacturing the element chip of an embodiment of the disclosure.
Figure 2B:
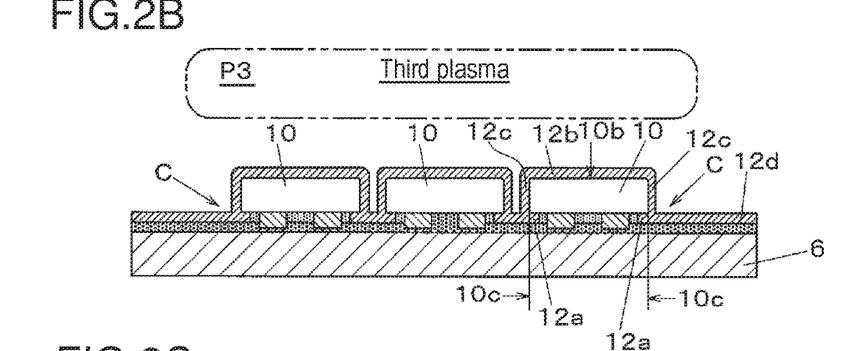
FIG. 2B is an explanatory view of a step in the method of manufacturing the element chip of an embodiment of the disclosure.

After the dividing step described above, element chip 10 is exposed by second plasma P2 in a state where spaces are held on carrier 6. That is, as illustrated in FIG. 2A, second plasma P2 (plasma for ashing) using second gas 26b is generated on the inside of processing chamber 21a in plasma etching device 20 and etching-resistant layer 5 that is formed mainly of resin is removed by ashing. Therefore, second surfaces 10b of element chips 10 divided into individual pieces are in a state of being exposed.

Figure 4A:
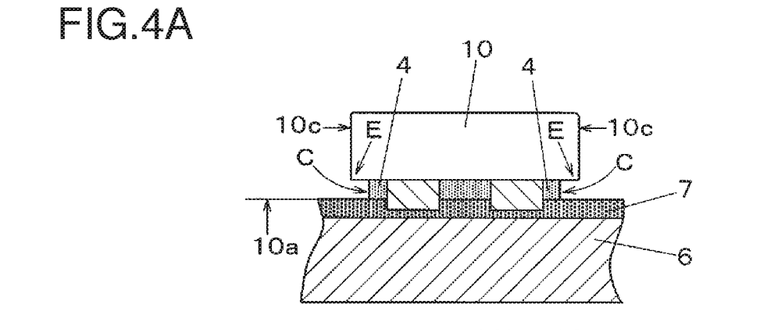
FIG. 4A is an enlarged explanatory view in step description of the method of manufacturing the element chip of an embodiment of the disclosure.

At the same time, in plasma processing by the second plasma, recessed portion C is formed in corner portion E by partially removing and retreating insulating film 4 formed of the organic film which is exposed in corner portion E by ashing (recessed portion forming step). Therefore, as illustrated in FIG. 4A, recessed portion C is formed in corner portion E that is formed by first surface 10a and side surface 10c in element chip 10 by partially removing and retreating the end portion of insulating film 4 exposed in etching groove 11 (see FIG. 2A).

As described above, it is possible to form recessed portion C by a relatively simple method such as ashing by the plasma processing by using the organic film such as polyimide as insulating film 4. The plasma processing as the recessed portion forming step for forming recessed portion C in corner portion E may be performed only by the first plasma. In this case, the recessed portion formation is performed by the plasma processing using the first plasma subsequently to the dividing step described above.

Conditions of ashing can be appropriately selected in accordance with a material of etching-resistant layer 5. For example, in a case where etching-resistant layer 5 is a resist film, the pressure on the inside of processing chamber is adjusted to 5 to 15 Pa while supplying oxygen at 150 to 300 sccm and supplying $CF_4$ at 0 to 50 sccm as raw material gas, input power from first high-frequency power supply unit 24 to antenna 23 is 1500 to 2500 W, input power from second high-frequency power supply unit 25 to the lower electrode may be 0 to 30 W. In the conditions, it is possible to remove etching-resistant layer 5 or insulating film 4 at a speed of appropriately 1 μm/min.

Figure 4B:
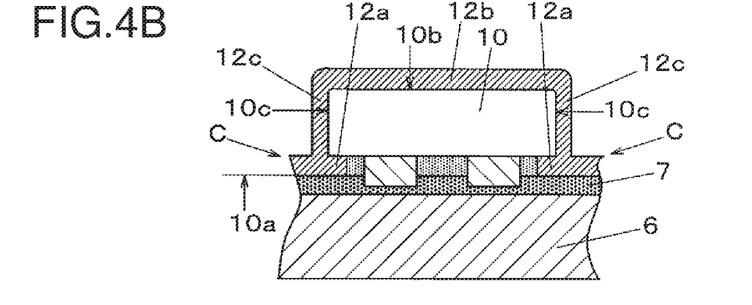
FIG. 4B is an enlarged explanatory view in the step description of the method of manufacturing the element chip of an embodiment of the disclosure.

Next, after the recessed portion forming step described above, as illustrated in FIG. 2B, a protection film forming step is performed. That is, in plasma etching device 20, element chips 10 are exposed to third plasma P3 generated while supplying third gas 26c that is protection film forming gas (gas containing fluorocarbon) on the inside of processing chamber 21a in a state of being held spaced from each other on carrier 6. Therefore, as illustrated in FIG. 4B, protection films 12b and 12c made of a film containing mainly fluorocarbon obtaining fluorine and carbon, where fluorocarbon in protection film forming gas is decomposed in the plasma and then being deposited and coated, is formed on each of second surface 10b and side surfaces 10c of element chip 10. At the same time, protection films 12a having the same compositions are also formed in the inside of recessed portions C that is formed in the recessed portion forming step in a form of filling recessed portions C.

Protection films 12a formed on the inside of recessed portions C are formed for the purpose of suppressing creep-up of the conductive material in the mounting process for directly bonding element chip 10 to the package substrate and the like. Therefore, it is preferable that the protection films have less hygroscopicity and dense composition. In the embodiment, as raw material gas of third plasma P3 used for forming the protection films, since protection film forming gas containing fluorocarbon is used, it is possible to form the protection films made of fluorocarbon film which has less hygroscopicity and dense composition, and excellent in adhesion. In the protection film forming step, high-frequency bias is applied to stage 22 (see FIG. 3) on which carrier 6 is mounted. Therefore, incidence of ions into element chip 10 is promoted and it is possible to form the protection film having more dense composition and high adhesion.

As conditions of the protection film formation, for example, the pressure on the inside of processing chamber is adjusted to 15 to 25 Pa while supplying $C_4F_8$ at 150 sccm and He at 50 sccm as raw material gas, input power from first high-frequency power supply unit 24 to antenna 23 is 1500 to 2500 W, input power from second high-frequency power supply unit 25 to the lower electrode may be 50 to 150 W. In the conditions, it is possible to form the protection film having a thickness of 3 μm by being processed for 300 seconds. In the embodiment, as raw material gas, mixed gas of fluorocarbon and helium is used and this is because dissociation of raw material gas is promoted in plasma by mixing helium and, as a result, it is possible to form the protection film which is dense and has high adhesion.

In the condition examples described above, the ratio of the flow ratio of He to the total flow rate of raw material gas is 25% (=50/(150+50)×100). As described below, it is preferable that the ratio is between 10% and 80%. That is, if the ratio of the flow ratio of He to the total flow rate of raw material gas is greater than 10%, the dissociation of raw gas is easily facilitated in the plasma and, as a result, it is possible to form the protection film which is further dense and has high adhesion. On the other hand, if the ratio of the flow ratio of He to the total flow rate of raw material gas is greater than 80%, the ratio of $C_4F_8$ occupied in raw material gas is reduced. Therefore, supply of components (C, F, and compounds thereof) in plasma contributing to the protection film formation to the surface of the substrate is insufficient, a deposition rate of the protection film on the surface of the substrate is slow, and productivity is lowered.

Next, a protection film removing step for removing an unnecessary portion of the protection film formed in the protection film forming step is performed. In the protection film forming step described above, protection film 12b is also formed on side surfaces 10c and second surface 10b together with first surface 10a of element chip 10 and recessed portion C (see FIG. 4B). In the embodiment, since protection films 12b and 12c are not necessary, plasma processing is performed using fourth plasma P4 for removing the films.

Figure 2C:
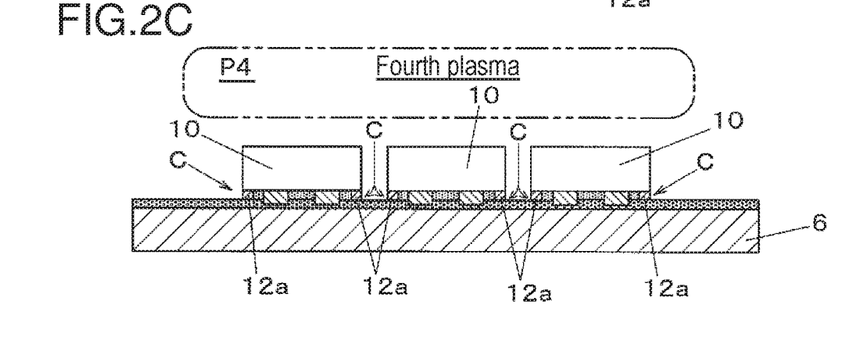
FIG. 2C is an explanatory view of a step in the method of manufacturing the element chip of an embodiment of the disclosure.

That is, in plasma etching device 20, fourth plasma P4 is generated while supplying fourth gas 26d that is protection film etching gas of which components are argon gas and oxygen gas on the inside of processing chamber 21a. As illustrated in FIG. 2C, element chips 10 are exposed to fourth plasma P4 in a state of being held spaced from each other on carrier 6. Therefore, at least a part of the protection film 12a formed in recessed portion C is left and protection film 12b that is formed on second surface 10b exposed on the upper surface in element chip 10 and protection film 12c that is formed on side surfaces 10c are removed by an etching operation of fourth plasma P4.

Figure 4C:
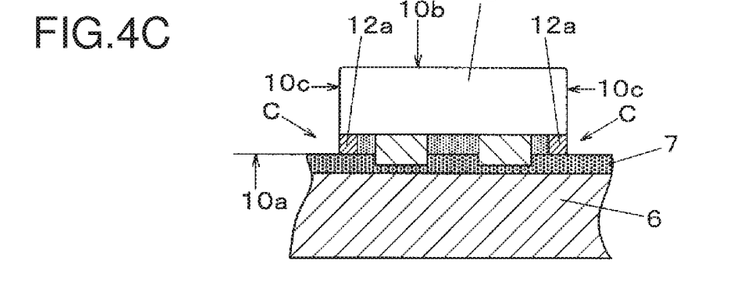
FIG. 4C is an enlarged explanatory view in the step description of the method of manufacturing the element chip of an embodiment of the disclosure.

Therefore, as illustrated in FIG. 4C, second surface 10b and side surfaces 10c of element chip 10 are in a state of being exposed. Protection film 12d (see FIG. 2B) of a range in which element chip 10 is not covered among protection films which are adhered on the upper surface of carrier 6 is also removed. Therefore, in element chip 10 after the protection film removing step, protection film 12a is in a state of being left only on the inside of recessed portion C.

As conditions of removing of the protection film, for example, the pressure on the inside of processing chamber is adjusted to 0.2 to 1.5 Pa while supplying Ar at 150 to 300 sccm and $O_2$ at 0 to 150 sccm as raw material gas, input power from first high-frequency power supply unit 24 to antenna 23 is 1500 to 2500 W, input power from second high-frequency power supply unit 25 to the lower electrode may be 150 to 300 W. In the conditions, it is possible to etch the protection film exposed to the upper surface at a speed of appropriately 0.5 μm/min.

Figure 5A:
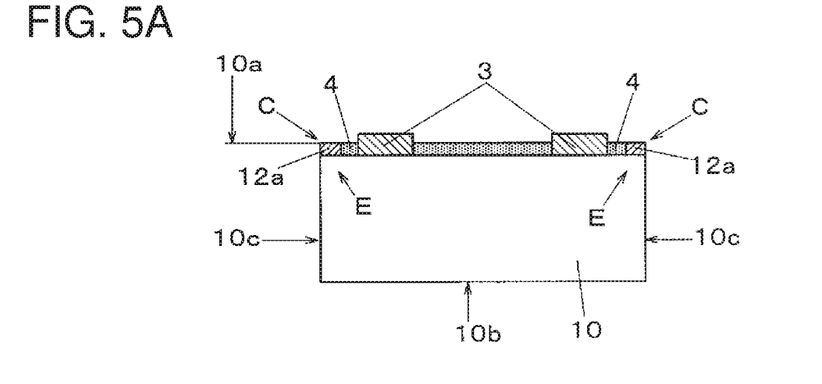
FIG. 5A is an explanatory view of a configuration of the element chip manufactured by the method of manufacturing the element chip of an embodiment of the disclosure.
Figure 5B:
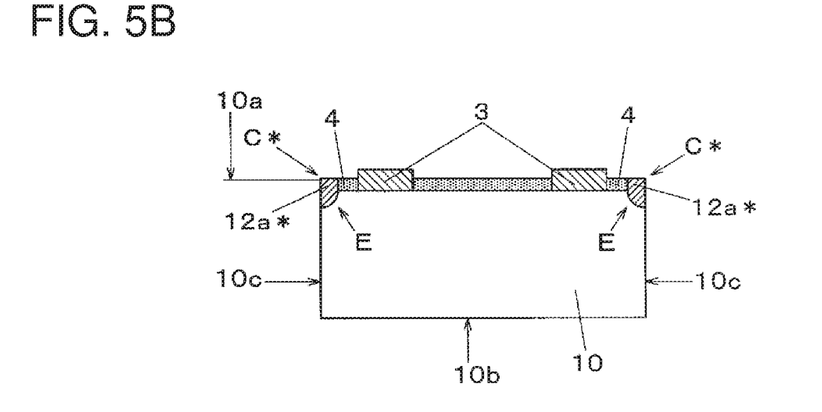
FIG. 5B is an explanatory view of a configuration of the element chip manufactured by the method of manufacturing the element chip of an embodiment of the disclosure.

FIGS. 5A and 5B illustrate element chip 10 that is manufactured by the method of manufacturing described above. That is, as illustrated in FIG. 5A, element chip 10 has first surface 10a which is covered by insulating film 4 and element electrode 3 protruding from insulating film 4 is formed in first surface 10a. Protection film 12a covering recessed portion C that is formed by retreating insulating film 4 is provided in corner portion E formed by first surface 10a and side surface 10c.

FIG. 5B illustrates an example in which recessed portion C* adjacent to the end portion of insulating film 4 in which element chip 10 is partially removed is formed in side surface 10c of element chip 10 in addition to insulating film 4 in the process for forming recessed portion C. That is, recessed portion C* is formed in corner portion E formed by first surface 10a and side surface 10c by retreating insulating film 4 and partially removing a region adjacent to the end portion of insulating film 4 in side surface 10c. Similar to the example illustrated in FIG. 5A, recessed portion C* is covered by protection film 12a*.

As described below, in a case where element chip 10 having such a configuration forms the electronic component-mounted structure by directly mounting on the printed circuit board and the like by soldering without going through a step of resin packaging and the like, spreading of the conductive material such as cream solder is suppressed in first surface 10a and an effect, in which the creep-up of the conductive material is prevented, is provided.

Figure 6A:
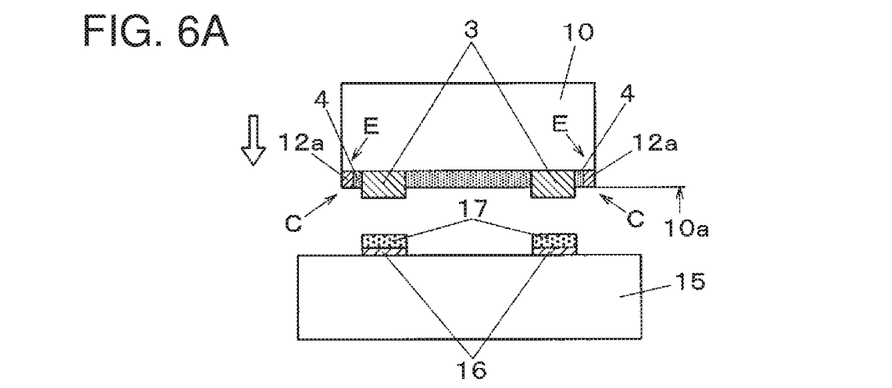
FIG. 6A is an explanatory view of a step in a method of manufacturing an electronic component-mounted structure of an embodiment of the disclosure.
Figure 6B:
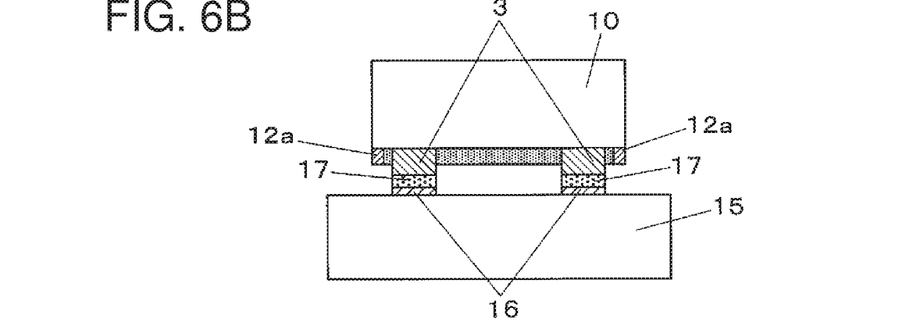
FIG. 6B is an explanatory view of a step in the method of manufacturing the electronic component-mounted structure of an embodiment of the disclosure.
Figure 6C:
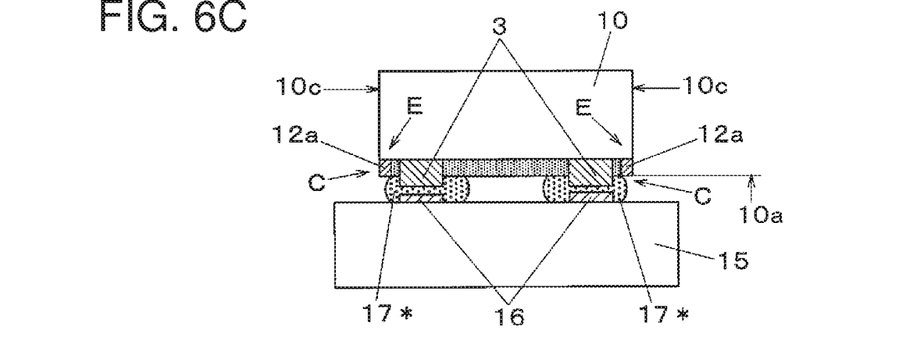
FIG. 6C is an explanatory view of a step in the method of manufacturing the electronic component-mounted structure of an embodiment of the disclosure.

Hereinafter, the electronic component-mounted structure which is formed by performing soldering the element chip 10 formed by the method of manufacturing the element chip described above to land electrodes formed in the printed circuit board, and a method of manufacturing the electronic component-mounted structure will be described with reference to FIGS. 6A to 6C. In FIG. 6A, land electrodes 16 are formed on an upper surface of printed circuit board 15 corresponding to element electrodes 3 for connecting element chips 10 having the configuration described above. Paste-like solder 17 (or solder paste) is supplied on land electrode 16 before mounting element chip 10 (solder paste supplying step).

Element chip 10 is mounted on printed circuit board 15 after the solder paste supplying step (mounting step). That is, element electrodes 3 of element chip 10 are aligned to corresponding land electrodes 16 and, as illustrated in FIG. 6B, element electrodes 3 are landed on the solders 17 on land electrodes 16. Therefore, element chip 10 is mounted on printed circuit board 15.

Next, printed circuit board 15 after the mounting step is sent to a reflow step and here, heating is performed for soldering. That is, printed circuit board 15 is heated, solders 17 are melted, and thereby element electrode 3 and land electrodes 16 are solder-jointed (melting step). Thereafter, printed circuit board 15 is cooled and melted solder is cooled and solidified (cooling step). Therefore, as illustrated in FIG. 6C, soldering portions 17* for solder-jointing element electrodes 3 and land electrodes 16 are formed.

Therefore, the electronic component-mounted structure that is formed by bonding element electrodes 3 formed in element chip 10 to land electrodes 16 formed in printed circuit board 15 using solders 17. In the electronic component-mounted structure, element chip 10 has element electrodes 3 formed on a surface facing printed circuit board 15, recessed portions C formed in corner portions E of the side surfaces of element chip 10 on printed circuit board 15 side, and protection films 12a covering recessed portions C. The creep-up of solder 17 on side surface 10c is suppressed by protection film 12a.

That is, since protection film 12a is left in recessed portion C, welding solder that is formed by causing solder 17 is molten in the melting step is in contact with protection film 12a. Surface properties of protection film 12a formed of the fluorocarbon film have a property of suppressing spreading of the melted solder. Therefore, the melted solders in which solders 17 are melted in the melting step are cooled and solidified around element electrodes 3 and land electrodes 16 without spreading along first surface 10a, and good soldering portions 17* are formed. That is, in the melting step described above, protection films 12a formed in recessed portion C suppress the creep-up of molten solder 17 to side surface 10c.

Therefore, in the mounting step of bonding element chip 10 to the object to be mounted such as printed circuit board 15 via the conductive material such as solder 17, it is possible to improve mounting quality by excluding various problems that may cause the creep-up of solder 17 to side surface 10c to occur.

For example, it is possible to improve the mounting quality by excluding short circuit between adjacent electrodes or an increase in current consumption due to the formation of an unnecessary electric circuit in side surface 10c of element chip 10.

The method of manufacturing the element chip, the method of manufacturing the electronic component-mounted structure, and the electronic component-mounted structure of the disclosure have the effect that creep-up of the conductive material can be suppressed in the mounting step and are useful in a field of manufacturing the element chips by dividing the substrate having the plurality of element regions for each of the element regions.

What is claimed is:

1. A method of manufacturing an element chip, in which a plurality of element chips are manufactured by dividing a substrate, which includes a first surface having a plurality of element regions defined by dividing regions and of which at least a part is covered with an insulating film, and a second surface on a side opposite to the first surface, at the dividing regions, the method comprising:

a preparing step of preparing the substrate in which a first surface side is supported on a carrier and an etching-resistant layer is formed so as to cover regions of the second surface opposite to the element regions and to expose regions of the second surface opposite to the dividing regions; and a plasma processing step of performing plasma processing on the substrate that is supported on the carrier after the preparing step, wherein the plasma processing step includes a dividing step of dividing the substrate into the element chips by etching the substrate of regions which are not covered by the etching-resistant layer in a depth direction of the substrate up to the first surface by exposing the second surface to first plasma and causing each of the element chips including the first surface, the second surface, and a side surface connecting the first surface and the second surface to be in a state of being held spaced from each other on the carrier and exposing the insulating film at a corner portion formed by the side surface and the first surface of each of the element chips, a recessed portion forming step of forming recessed portions by retreating the insulating film that is exposed to the corner portion by exposing the element chips to second plasma in a state where the element chips are held spaced from each other on the carrier after the dividing step, and a protection film forming step of forming a protection film on the second surface of the element chips, the side surface of the element chips, and the recessed portion by exposing the element chips to third plasma generated during supplying of protection film forming gas in a state where the element chips are held spaced from each other on the carrier after the recessed portion forming step.

2. The method of manufacturing an element chip of claim 1, further comprising:

a protection film removing step of removing the protection film, which is formed on the second surface and the side surface of the element chips, while leaving at least a part of the protection film formed in the recessed portions by exposing the element chips to fourth plasma in a state where the element chips are held spaced from each other on the carrier after the protection film forming step.

3. The method of manufacturing an element chip of claim 1,
wherein the insulating film is an organic film.

4. The method of manufacturing an element chip of claim 1,
wherein the protection film is composed mainly of fluorocarbon.

5. The method of manufacturing an element chip of claim 4,
wherein the protection film forming gas contains fluorocarbon.

6. A method of manufacturing an electronic component-mounted structure which is formed by bonding element electrodes included on the first surface of an element chip formed by the method of manufacturing an element chip of claim 1 to land electrodes formed in a printed circuit board by bonding portions formed by the element electrodes and solders, the method comprising:

a solder paste supplying step of supplying a solder paste including a solder on the land electrodes;

a mounting step of mounting the element electrodes on the printed substrate by causing the element electrodes to be landed on the solder paste supplied on the corresponding land electrodes;

a melting step of forming the bonding portions for soldering between the element electrodes and the land electrodes by melting the solder by heating the printed circuit board; and a cooling step of solidifying the melted solder by cooling the printed circuit board, wherein in the melting step, the protection film formed in the recessed portions suppresses creep-up of the melted solder on the side surface.

* * * * *